(12) United States Patent
Porco et al.

(10) Patent No.: US 8,140,606 B2
(45) Date of Patent: Mar. 20, 2012

(54) METHOD AND APPARATUS FOR A FAIL SAFE FOURIER TRANSFORM MATRIX

(75) Inventors: Ronald L. Porco, Fort Worth, TX (US); Leroy A. Plymale, Jr., North Richland Hills, TX (US)

(73) Assignee: Motorola Mobility, Inc., Libertyville, IL (US)

( * ) Notice: Subject to any disclaimer, the term of this patent is extended or adjusted under 35 U.S.C. 154(b) by 1127 days.

(21) Appl. No.: 11/957,671

(22) Filed: Dec. 17, 2007

(65) Prior Publication Data

US 2009/0157786 A1 Jun. 18, 2009

(51) Int. Cl.
*G06F 11/20* (2006.01)

(52) U.S. Cl. ........................................ 708/530

(58) Field of Classification Search .................. None
See application file for complete search history.

(56) References Cited

U.S. PATENT DOCUMENTS

| | | | |
|---|---|---|---|
| 5,742,584 A | | 4/1998 | Meredith |
| 5,825,762 A | * | 10/1998 | Kamin et al. ............... 370/335 |
| 7,020,215 B2 | * | 3/2006 | Porco et al. ................. 375/297 |
| 7,555,053 B2 | * | 6/2009 | Trachewsky et al. ....... 375/267 |
| 2003/0179833 A1 | * | 9/2003 | Porco et al. ................. 375/297 |
| 2004/0062453 A1 | * | 4/2004 | Ludwig ....................... 382/280 |
| 2004/0192212 A1 | * | 9/2004 | Hagen ........................ 455/67.11 |
| 2006/0270353 A1 | * | 11/2006 | Webster et al. ............. 455/63.4 |
| 2007/0026899 A1 | | 2/2007 | Porco et al. |
| 2009/0149144 A1 | * | 6/2009 | Luz et al. .................... 455/216 |

FOREIGN PATENT DOCUMENTS

WO 03081792 A1 10/2003

* cited by examiner

*Primary Examiner* — David H Malzahn

(57) ABSTRACT

A base station transmitter for maintaining data rate transmission between a set of Fourier Transform matrices, having a digital Fourier Transform Matrix (FTM), and analog FTM, and a plurality of transmit paths therebetween. During the occurrence of a power amplifier failure, the method includes detecting the failure of a power amplifier (PA); and reconfiguring the digital FTM and analog FTM to a pass-thru mode.

20 Claims, 11 Drawing Sheets

METHOD AND APPARATUS FOR A FAIL SAFE FOURIER TRANSFORM MATRIX

FIELD OF THE INVENTION

The present invention relates generally to wireless communications systems employing Fourier transform matrices, and, more particularly to a fail safe fault-tolerant amplifier matrix.

BACKGROUND

Amplifier matrixes such as the well-known Fourier transform matrix (FTM) have been used in cellular base stations for quite some time. FTMs are used in cellular base stations to evenly balance and distribute power amongst multiple amplifiers incorporated into the transmitters of the base station. If there is a failure in one of the transmit paths on a base station, the isolation of the transmit sectors created by the amplifiers and their associated antennas will degrade. The degradation will result in lost transmission to the mobile devices or, at a minimum, a lower data rate to these devices. This result was acceptable in most voice-only mobile device systems, but is devastating to data-only or mainly data systems of modern day mobile device networks.

What is needed is a system and method for maintaining data rate transmission across the transmit path sectors of a base station during the occurrence of a failure in one of the transmit paths.

BRIEF DESCRIPTION OF THE FIGURES

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

Figure 1A:
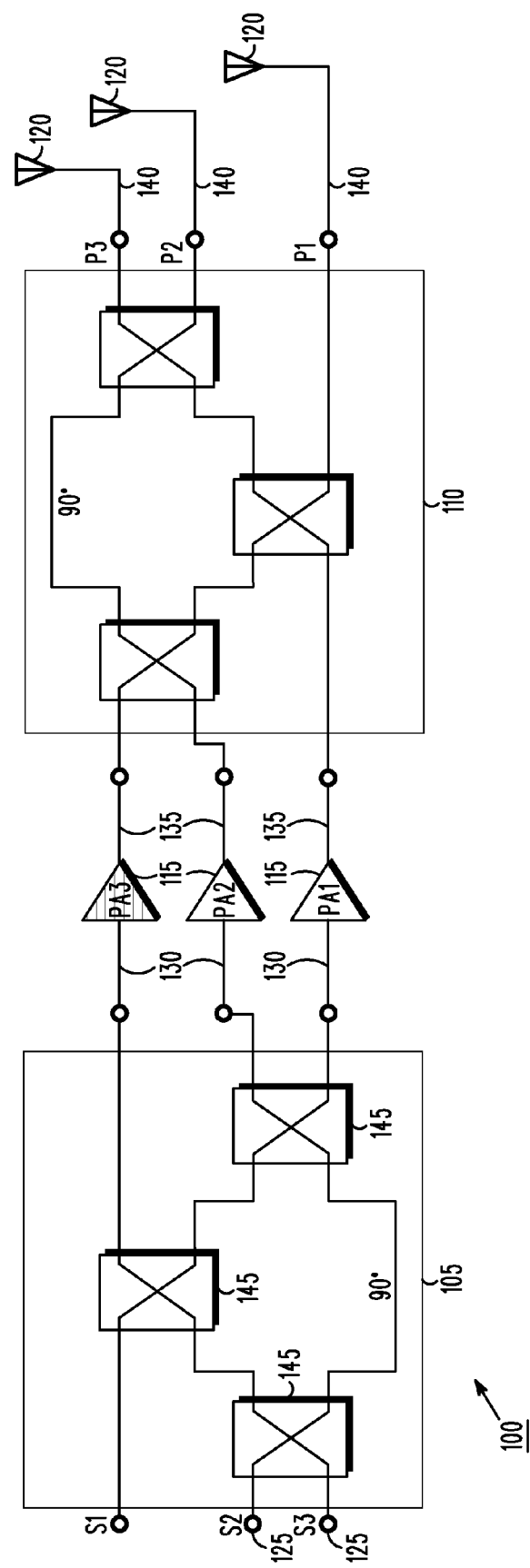
FIG. 1A is an example a Fourier Transform matrix pair configuration in accordance with some embodiments of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to creating a Fail-Safe Fourier Transform Matrix. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," "including," "includes," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

It will be appreciated that embodiments of the invention described herein may be comprised of one or more conventional processors and unique stored program instructions that control the one or more processors to implement, in conjunction with certain non-processor circuits, some, most, or all of the functions of creating a fail-safe Fourier Transform Matrix described herein. The non-processor circuits may include, but are not limited to, a radio receiver, a radio transmitter, signal drivers, clock circuits, power source circuits, and user input devices. As such, these functions may be interpreted as steps of a method to perform a fail-safe transform matrix amplification. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

An exemplary method and apparatus for maintaining data rate transmission between a set of Fourier Transform matrices, having a digital Fourier Transform Matrix (FTM), and analog FTM, and a plurality of transmit paths therebetween, during the occurrence of a transmit path failure is disclosed. The method includes detecting a failure of a component in the transmit path, e.g. a power amplifier (PA); determining what matrix configuration is in place; and reconfiguring the digital FTM and analog FTM to a pass-thru mode.

An illustration of Fourier transform matrix configuration 100 used to evenly distribute power amongst three amplifiers is provided in FIG. 1A. Typically, a Fourier Transform Matrix (FTM) has an input matrix portion 105, an output matrix portion 110, exciters and amplifiers coupled therebetween 115, and antennas 120 coupled to the outputs of the output matrix.

When FTMs are paired to transmit to different sectors 125 in a cellular system, optimal signal quality and isolation between sectors will be attained if each of the transmit paths 130 has the same gain and phase. Such a system is said to have a high degree of Sector-to-Sector Isolation (SSI). Imbalances between transmit paths 130 in either gain or phase will degrade the SSI resulting in decreased transmission quality and, in some systems, decreased data transmission rates or complete loss of the desired signal.

Under normal conditions, the amplified outputs of the input portion 135 (i.e., outputs PA1 through PA3) have well-defined mathematical relationships such as, for example,
Input Matrix Equations $$PA3 = \frac{1}{\sqrt{3}} \cdot \vec{S}1 \angle 0° + \frac{1}{\sqrt{3}} \cdot \vec{S}2 \angle -90° + \frac{1}{\sqrt{3}} \cdot \vec{S}3 \angle -180° \quad \text{Equation 1}$$

$$PA2 = \frac{1}{\sqrt{3}} \cdot \vec{S}1 \angle -90° + \frac{1}{\sqrt{3}} \cdot \vec{S}2 \angle 60° + \frac{1}{\sqrt{3}} \cdot \vec{S}3 \angle -150° \quad \text{Equation 2}$$

$$PA1 = \quad \text{Equation 3}$$
$$\frac{1}{\sqrt{3}} \cdot \vec{S}1 \angle -180° + \frac{1}{\sqrt{3}} \cdot \vec{S}2 \angle -150° + \frac{1}{\sqrt{3}} \cdot \vec{S}3 \angle -120°$$

The outputs of the output portion 140 (i.e., outputs Z1 through Z3 not shown) have the following mathematical relationships:
Output Matrix Equations $$P1 = \frac{1}{\sqrt{3}} \cdot PA1 \angle 0° + \frac{1}{\sqrt{3}} \cdot PA2 \angle -90° + \frac{1}{\sqrt{3}} \cdot PA3 \angle -180° \quad \text{Equation 4}$$

$$P2 = \frac{1}{\sqrt{3}} \cdot PA1 \angle -90° + \frac{1}{\sqrt{3}} \cdot PA2 \angle 60° + \frac{1}{\sqrt{3}} \cdot PA3 \angle -150° \quad \text{Equation 5}$$

$$P3 = \frac{1}{\sqrt{3}} \cdot PA1 \angle -180° + \quad \text{Equation 6}$$
$$\frac{1}{\sqrt{3}} \cdot PA2 \angle -150° + \frac{1}{\sqrt{3}} \cdot PA3 \angle -120°$$

These equations reflect a desired isolation characteristic at the outputs of the output matrix 110. The notations at the input 135 and output 140 of the output FTM 110 in FIG. 1A match those of an analog FTM. The input FTM 105 shown in FIG. 1A is actually a digital FTM with the phasor relationships shown in Table 1 and given by Equations 1-3. The notations at the input 135 and output 140 of the output FTM 110 in FIG. 1A match those of a typical analog FTM.

Ideal Sector-to-Sector Isolation (SSI) is achieved when the input 105 and output 110 matrices match equations 1-3 and 4-6, respectively, and there is no variation in gain or phase between these two FTMs 105, 110. The cross link blocks 145 shown in FIG. 1A represent combiners. The forward link blocks 115 shown in FIG. 1A represent the exciters and power amplifiers and, for the purposes of Equations 1-6, were considered to be unity gain blocks with zero degree phases. With that being the case, Equations 4 thru 6 will simplify to:

$$P1 = \vec{S}1 \angle 180°, P2 = \vec{S}2 \angle 120°, \text{ and } P3 = \vec{S}3 \angle 60°$$

Thus, perfect isolation is achieved. Gain and phase imbalances are tuned out at Power Amplifier (PA) sub-assembly test and again at the base-station to produce optimal Sector-to-Sector Isolation.

However, if there is a failure in any path, e.g. a power amplifier 115 shuts down, the isolation will severely degrade. Previous cellular or mobile voice-only systems were relatively impervious to this degradation due to the lower waveform quality requirements necessary to demodulate the signal. The newer data-only cellular or mobile device schemes have more stringent requirements than the previous systems. Failure of one branch within an FTM could not only take down one sector, but an entire base station site. For example, cdma2000 has an error vector magnitude (EVM) requirement of 30%. The recommended EVM for the highest data rate of EV-DO is 7.75% and for Platinum Multicast it is 6.5%. A downed Power Amplifier (PA) 115 in a single FTM configuration 100 will result in very poor EVM and will essentially shut down all 3 sectors of the base station. Losing a PA 115 in a system that consists of multiple FTMd base-stations being combined may not completely shut down all 3 sectors but will reduce the data rate on all sectors to a crawl.

Figure 2:
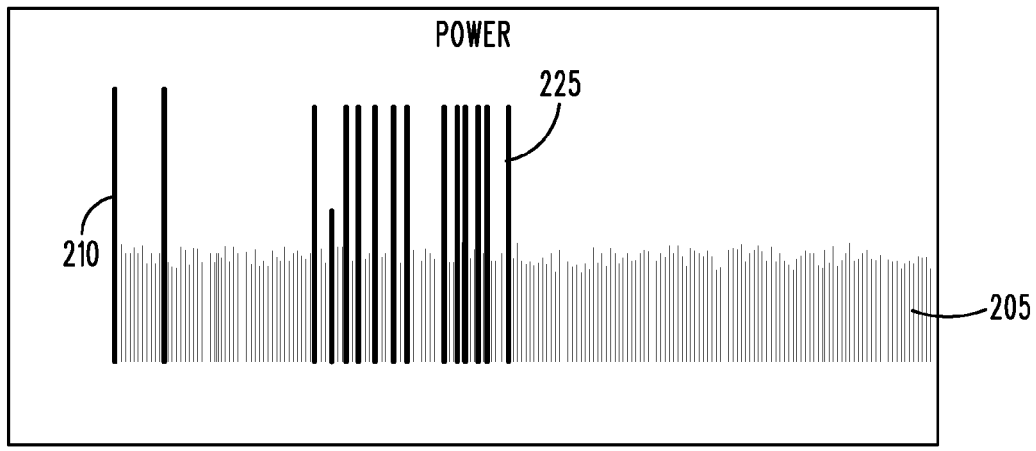
FIG. 2 is an example measurements of the prior art matrix of FIG. 1 before and after a fault.
Figure 2:
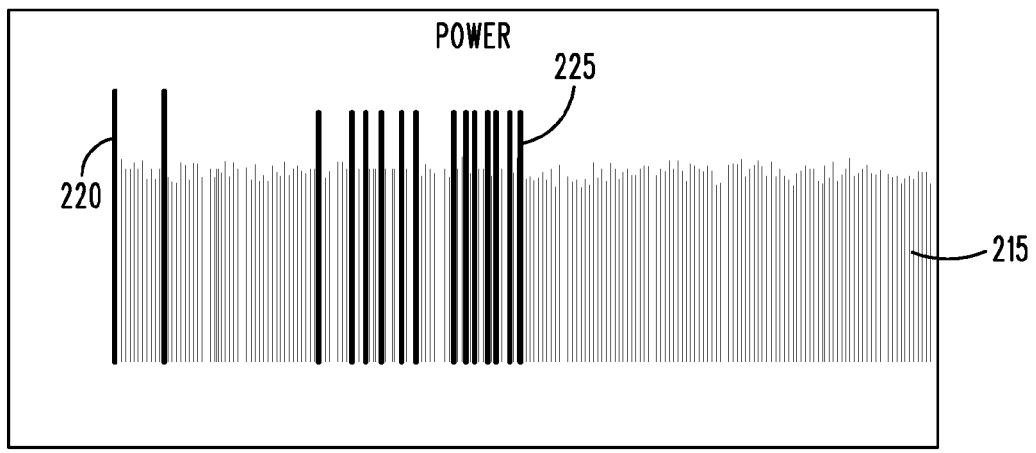

FIG. 2 shows by way of example reference 205, which depicts the peak code domain power of a UMTS (Universal Mobile Telecommunications Service) signal at the output portion of an FTM with all amplifiers operating properly. Under normal operating conditions, for example, the Error Vector Magnitude (EVM) of the UMTS signal output portion is 5% and the peak code domain error is −45.7 dB 210. However, after a failure of one of the transmit paths, for example, a failure of one of the power amplifiers, the peak code domain error rises significantly. FIG. 2 also shows, by way of example, reference 215, the signal at the output portion with one amplifier eliminated. The EVM and peak code domain error of the UMTS signal of output portion 110 have degraded to 65.5% and −26.5 dB 220, respectively. Under these conditions, the code domain noise of reference 215 has risen 20 dB compared to reference 205.

Referring back now to FIG. 1A, the Fourier transform matrix 100 has an input Fourier transform matrix 105 and an output Fourier transform matrix 110. Each of these Fourier transform matrices or FTM's receives a set of input signals that are transformed into a set of output signals. The FTM's may be variously implemented in hardware, software or a combination thereof. For simplicity, standard FTM symbology has been used in FIG. 1A. In FIG. 1A the inputs 125 to input FTM 105 are shown as S1, S2 and S3. The outputs of output FTM 105 correspond to the inputs to power amplifiers, PA3, PA2 and PA1 115. The outputs of PA3, PA2 and PA1 115

TABLE 1

| | Input Matrix | | | Output Matrix | | |
|---|---|---|---|---|---|---|
| | PA3 | PA2 | PA1 | | P1 | P2 | P3 |
| S1 | 0.577∠0° | 0.577∠−90° | 0.577∠−180° | PA1 | 0.577∠0° | 0.577∠−90° | 0.577∠−180° |
| S2 | 0.577∠−90° | 0.577∠60° | 0.577∠−150° | PA2 | 0.577∠−90° | 0.577∠60° | 0.577∠−150° |
| S3 | 0.577∠−180° | 0.577∠−150° | 0.577∠−120° | PA3 | 0.577∠−180° | 0.577∠−150° | 0.577∠−120° | correspond to the inputs of output FTM 110. The outputs 140 of FTM 110 are denoted as P3, P2 and P1. It can be seen from FIG. 1A that the exemplary FTMs 105 and 110 are 3×3 matrices, but larger N×N matrices could be used with additional inputs and outputs. It may also be seen from FIG. 1A that transmit paths one, two and three 130 are provided for the transmission of signals between input FTM 105 and output FTM 110. The transmit paths may comprise exciters, power amplifiers and/or other equipment necessary for transmission and/or conditioning of the signals between input FTM 105 and output FTM 110. Such additional elements that may be included in the transmit paths are not shown for clarity reasons.

In the embodiment shown in FIG. 1A, the input FTM 105 and the output FTM 110 have a mathematical relationship regarding their respective inputs and outputs. An example of the mathematical relationship between the input 125 and output of the input FTM 105 is shown in Table 1 as the Input Matrix. The relationship between the inputs 135 and the outputs 140 of the output FTM 110 are shown under the Output Matrix shown in Table 1. The relationship between the inputs and outputs provided by FTM 105 can also be represented more formally by the Equations 1, 2 and 3, shown again below. The equations below match Table 1 with $1/\sqrt{3}$ being equal to 0.577 to three decimal places.

$$PA3 = \frac{1}{\sqrt{3}} \cdot \vec{S}1 \angle 0° + \frac{1}{\sqrt{3}} \cdot \vec{S}2 \angle -90° + \frac{1}{\sqrt{3}} \cdot \vec{S}3 \angle -180° \quad \text{Equation 1}$$

$$PA2 = \frac{1}{\sqrt{3}} \cdot \vec{S}1 \angle -90° + \frac{1}{\sqrt{3}} \cdot \vec{S}2 \angle 60° + \frac{1}{\sqrt{3}} \cdot \vec{S}3 \angle -150° \quad \text{Equation 2}$$

$$PA1 = \frac{1}{\sqrt{3}} \cdot \vec{S}1 \angle -180° + \frac{1}{\sqrt{3}} \cdot \vec{S}2 \angle -150° + \frac{1}{\sqrt{3}} \cdot \vec{S}3 \angle -120° \quad \text{Equation 3}$$

Equations 4, 5, and 6, reproduced below, illustrate the relationship between the inputs 135 and the outputs 140 at FTM 110.

$$P1 = \frac{1}{\sqrt{3}} \cdot PA1 \angle 0° + \frac{1}{\sqrt{3}} \cdot PA2 \angle -90° + \frac{1}{\sqrt{3}} \cdot PA3 \angle -180° \quad \text{Equation 4}$$

$$P2 = \frac{1}{\sqrt{3}} \cdot PA1 \angle -90° + \frac{1}{\sqrt{3}} \cdot PA2 \angle 60° + \frac{1}{\sqrt{3}} \cdot PA3 \angle -150° \quad \text{Equation 5}$$

$$P3 = \frac{1}{\sqrt{3}} \cdot PA1 \angle -180° + \frac{1}{\sqrt{3}} \cdot PA2 \angle -150° + \frac{1}{\sqrt{3}} \cdot PA3 \angle -120° \quad \text{Equation 6}$$

As previously stated, ideal SSI is achieved when the input and output matrices match equations 1-3 and 4-6 respectively and there is insignificant variation in gain or phase between the FTM 105 and the FTM 110. In an ideal case, there would be no difference between gain or phase of a signal passed through transmit paths 130. However, any gain or phase variation in one path 130 that is not duplicated in the other two paths 130 will result in a degradation of the sector-to-sector isolation as illustrated in FIG. 2. As a transmit path fails, for example when PA3 115 fails, the EVM and peak code domain error of the UMTS signal of output portion 110 have degraded to 65.5% and −26.5 dB 220, respectively. Under these conditions, the code domain noise of reference 215 has risen 20 dB compared to reference 205.

Figure 1B:
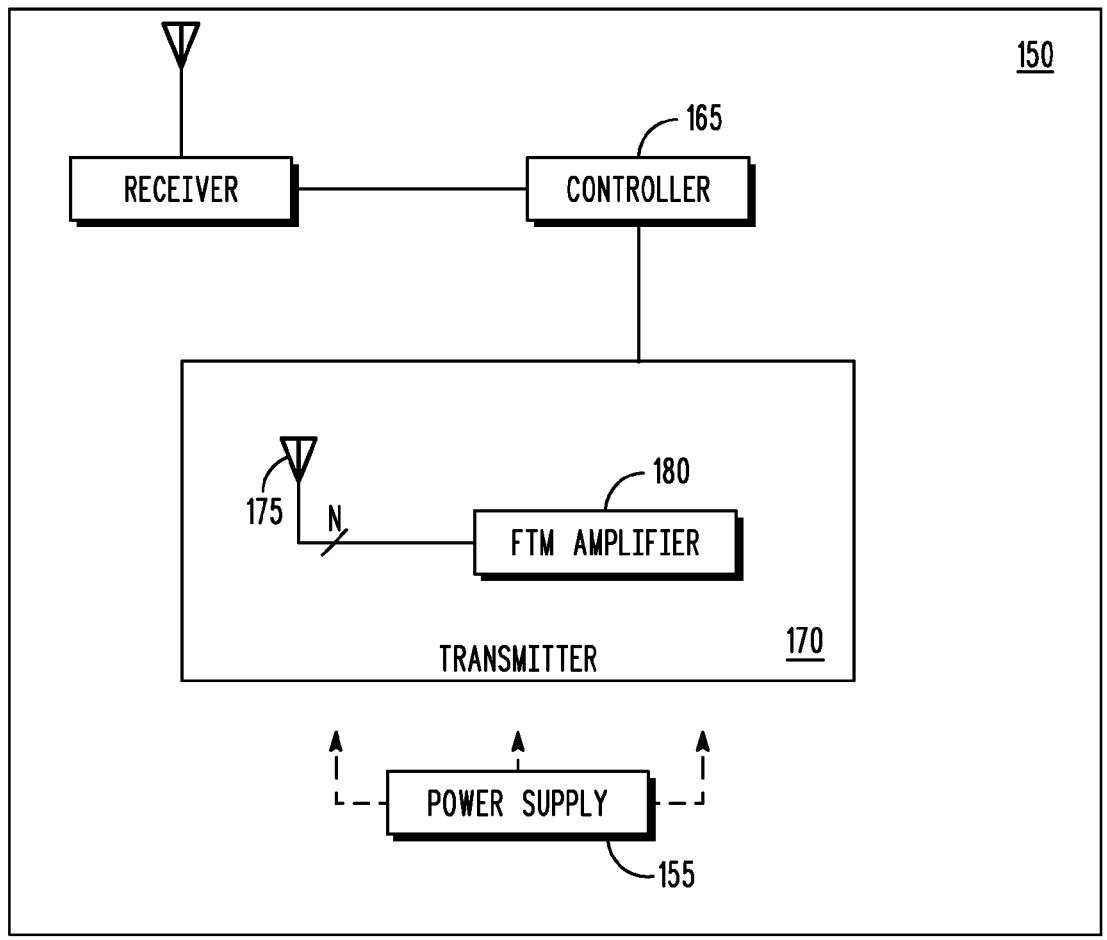
FIG. 1B a block diagram of an exemplary base-station in accordance with an embodiment of the invention.

Referring now to FIG. 1B, an exemplary base-station 150 for a wireless system is shown. The base-station 150 has a power supply 155, a receiver 160, a controller 165 and a transmitter 170. The transmitter 170 has an antenna 175 and a Fourier Transform Matrix Configuration Amplifier 180. The Fourier Transform Matrix Configuration Amplifier 180 comprises at least one FTM configuration 100 of FIG. 1A.

Figure 3:
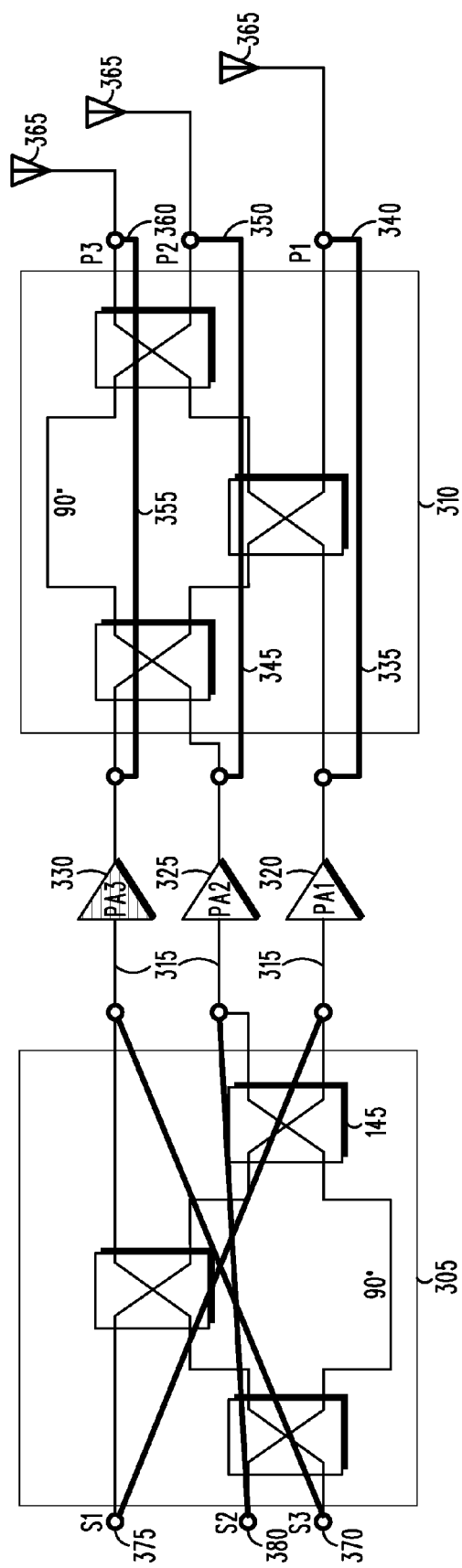
FIG. 3 is an example a Fourier Transform matrix pair configuration with a Power Amplifier failure in accordance with some embodiments of the invention.

Referring now to FIG. 3, an example of a Fourier Transform matrix pair configuration with a Power Amplifier failure in accordance with some embodiments of the invention is shown. The matrix is illustrated as a 3×3 matrix. However, skilled artisans would appreciate that larger N×N matrices with more inputs and outputs can be used. The matrix configuration 300 has an input FTM 305, an output FTM 310, and three transmit paths 315 with amplifiers, PA1 320, PA2 325, and PA3 330 therebetween. The input FTM 305 is a digital FTM. The output FTM 310 is an analog FTM. A first RF switch 335 is connected on one end to the output of PA1 320. The first RF switch 335 is connected on the other end to the output P1 340 of the output FTM 310. A second RF switch 345 is connected on one end to the output of PA2 325. The second RF switch 350 is connected on the other end to the output P2 350 of the output FTM 310. A third RF switch 355 is connected on one end to the output of PA3 330. The third RF switch 355 is connected on the other end to the output P3 360 of the output FTM 310. The outputs, P1 340, P2 350, and P3 360 of the output FTM 310 are each connected to an antenna 365. The RF switches 335, 345 and 355 may each be referred to as an RF by-pass route.

When a transmit path fails, for example when PA3 330 fails, the sector outputs 340, 350, and 360 may not completely shut down. However, the failure will result in significant reduction in data rate transmission or potential data rate transmission. To maintain data rate transmission, the input FTM 305 and output FTM 310 are set to a pass-thru mode. The pass-thru mode allows each input signal to be passed directly to the associated forward path link with ideally no change in amplitude or phase. The RF switches 335, 345, 355 are closed. The operation of closing RF switches 335, 345, 355 creates a thru path across or by-pass around the output FTM 310. Since the input FTM 305 is digital, the sector paths are controlled by an input table. In order to set the input FTM 305 to a pass-thru mode, the input table must be replaced with a pass-thru table. The operation of setting the input FTM 305 to a pass-thru mode creates a thru path across the input FTM 305.

The thru paths are configured to provide the same phase at the sector outputs as the input FTM 305 and output FTM 310 provide when no path failure exists. Therefore, a wireless system with multiple base-stations is setup where each base station uses a digital FTM. The sector outputs of the analog (output) FTMs are combined. Thus, multiple stations remain operating in the FTM configurations while a station with the damaged PA is able operate in a straight pass-thru mode.

Phase information at 2.12 GHz from an existing FTM is shown in Table 2.

TABLE 2

| | Phase shift through FTM | | | | | | | | |
|---|---|---|---|---|---|---|---|---|---|
| | P1-PA1 | P1-PA2 | P1-PA3 | P2-PA1 | P2-PA2 | P2-PA3 | P3-PA1 | P3-PA2 | P3-PA3 |
| S21(phase) | 172.3 | 83.6 | −7.7 | 80.4 | −125.9 | 21.2 | 122.8 | 154.9 | −177.2 |
| Ideal | 0.0 | −90.0 | −180.0 | −90.0 | 60.0 | −150.0 | −180.0 | −150.0 | −120.0 |

TABLE 2-continued

| | Phase shift through FTM | | | | | | | | |
|---|---|---|---|---|---|---|---|---|---|
| | P1-PA1 | P1-PA2 | P1-PA3 | P2-PA1 | P2-PA2 | P2-PA3 | P3-PA1 | P3-PA2 | P3-PA3 |
| Phase Delta | 172.3 | 173.6 | 172.3 | 170.4 | 174.1 | 171.2 | −57.2 | −55.1 | −57.2 |
| Avg Phase Shift | | 172.7 | | | 171.9 | | | −56.5 | |

As can be seen, there is an additional shift of 172.7° at output FTM 310 output P1 340, a shift of 171.9° at P2 350, and a shift of −56.5° on P3 360. Reviewing our equations from before, where:

$$P1 = \vec{S}1 \angle 180°, P2 = \vec{S}2 \angle 120°, \text{ and } P3 = \vec{S}3 \angle 60°.$$

Adding the phase shifts calculated above, the exact phases measured at the outputs become:

$$P1 = \vec{S}1 \angle -7.3°, P2 = \vec{S}2 \angle -68.1°, \text{ and } P3 = \vec{S}3 \angle 3.5°.$$

These equations represent the phases the pass-thru paths would ideally measure to provide optimal combining of multiple base stations. It should be noted, however, that the phase accuracy at the sector output ports is not nearly as critical as phase balance within an FTM. This is due to the fact that a phase imbalance at the sector port will result in imperfect combining. However, even a 20° phase error will result in a loss in power of only about 0.1 dB. Therefore as long as the thru paths and the FTM paths show similar phase shifts versus frequency, no further adjustment needs to be made.

The phase of each of the paths can also be adjusted using the digital phase adjuster, not specifically shown, on the transceiver if it is so desired. Therefore, even if the passive pass-thru path does not match the phase shift of the FTM path the phase could be matched by using a phase adjuster anywhere in the forward link. The matching of phase could be a factory calibration step and could even include a table of phase offsets based on the frequency.

The absolute phase of the sectors is unimportant when there is no post FTM combining. Thus, to effectively reprogram the input FTM 305 to be a pass-thru path, the input table used to configure the input FTM 305 would be replaced by the input table shown in Table 3:

TABLE 3

| Reconfigured Digital FTM (Thru phase shift equals FTM phase shift) | | | |
|---|---|---|---|
| | Path 3 | Path 2 | Path 1 |
| S1 | 0 | 0 | 1∠0° |
| S2 | 0 | 1∠0° | 0 |
| S3 | 1∠0° | 0 | 0 |

Figure 4:
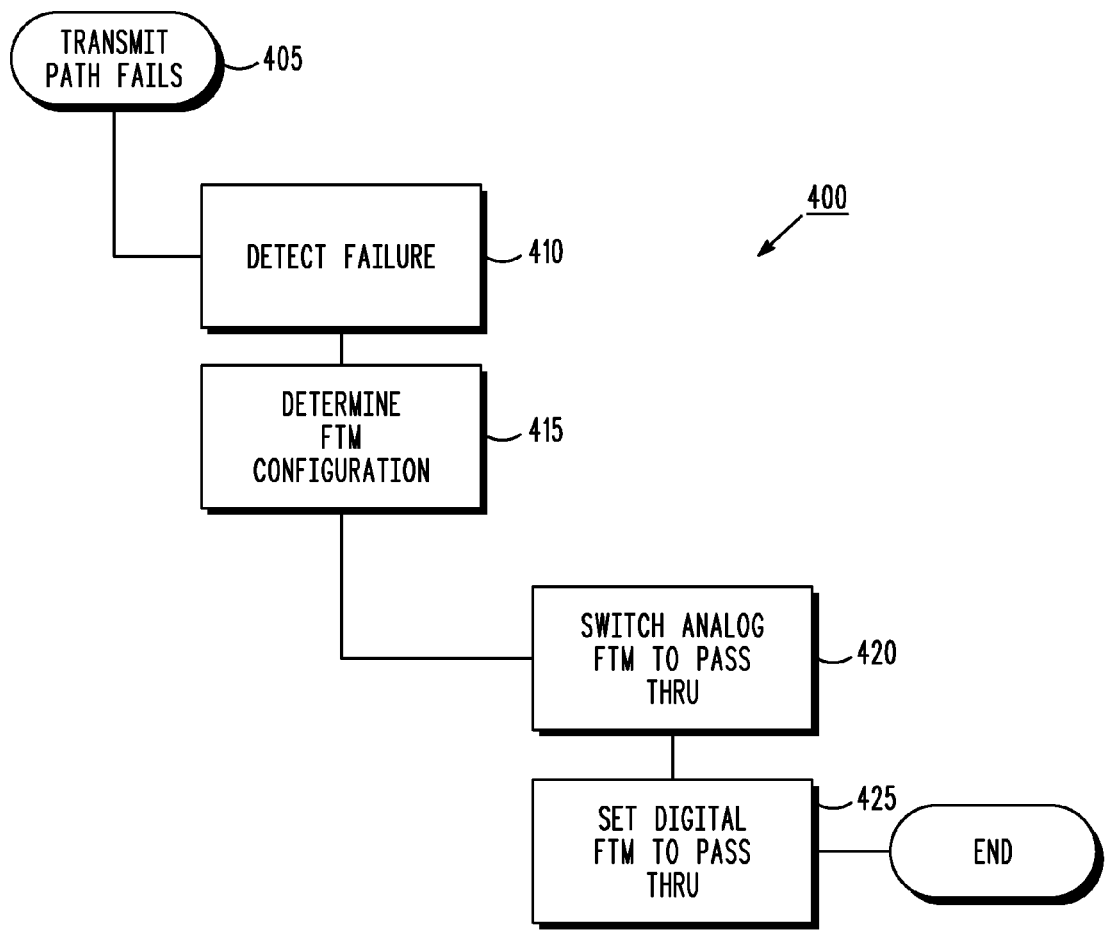
FIG. 4 is a flow diagram illustrating one exemplary mode of operation of the FTM pair configuration of FIG. 3.

Referring now to FIG. 4, a flow diagram illustrating one exemplary mode of operation of the FTM pair configuration of FIG. 3 is shown. The flow diagram 400 corresponds to one exemplary method of reconfiguring the FTM matrix 300 of FIG. 3 to achieve minimal data-rate transmission loss upon the occurrence of a transmit path, e.g., PA3 360, failure. The steps and methods described with respect to FIG. 4 could be programmed to occur during a time when little or no data transmission is occurring on any of the transmit paths 315, e.g. during an idle slot in a time division duplexed (TDD) signal.

Beginning at step 405, PA3 360 fails. At step 410, a controller 165 on the base station 150 detects the transmit path failure. The transmit failure may be, for example, a complete shutdown of PA3 360, or the failure may be that PA3 360 is operating below an acceptable performance level. At step 415, the controller 165 determines that the matrix configuration 300 is a matrix pair, eg., one input matrix 305 associated with one output matrix 310. Without manual intervention, the controller 165 switches the output FTM 310 to a pass-thru mode at step 420. The controller 165 switches the output FTM 310 to a pass-thru mode by closing the RF switches 335, 345, 355.

At step 425, the input FTM 305 is set to a pass-thru mode. The controller 165 sets the input FTM 305 to a pass-thru mode by replacing usage of the input table with the pass-thru table. The order of steps 420 and 425 is exemplary. Step 425, wherein the input FTM 305 is set to a pass-thru mode, may occur prior to step 420, the controller switching the output FTM 310 to a pass-thru mode.

In this example, the input FTM 305 and the output FTM 310 are reconfigured as the result of the failure of PA3 360. Sector three, S3 370 is no longer transmitted. However, Sector one, S1 375, and Sector two, S2 380 continue to operate at full power and full data transmission rate.

Figure 5:
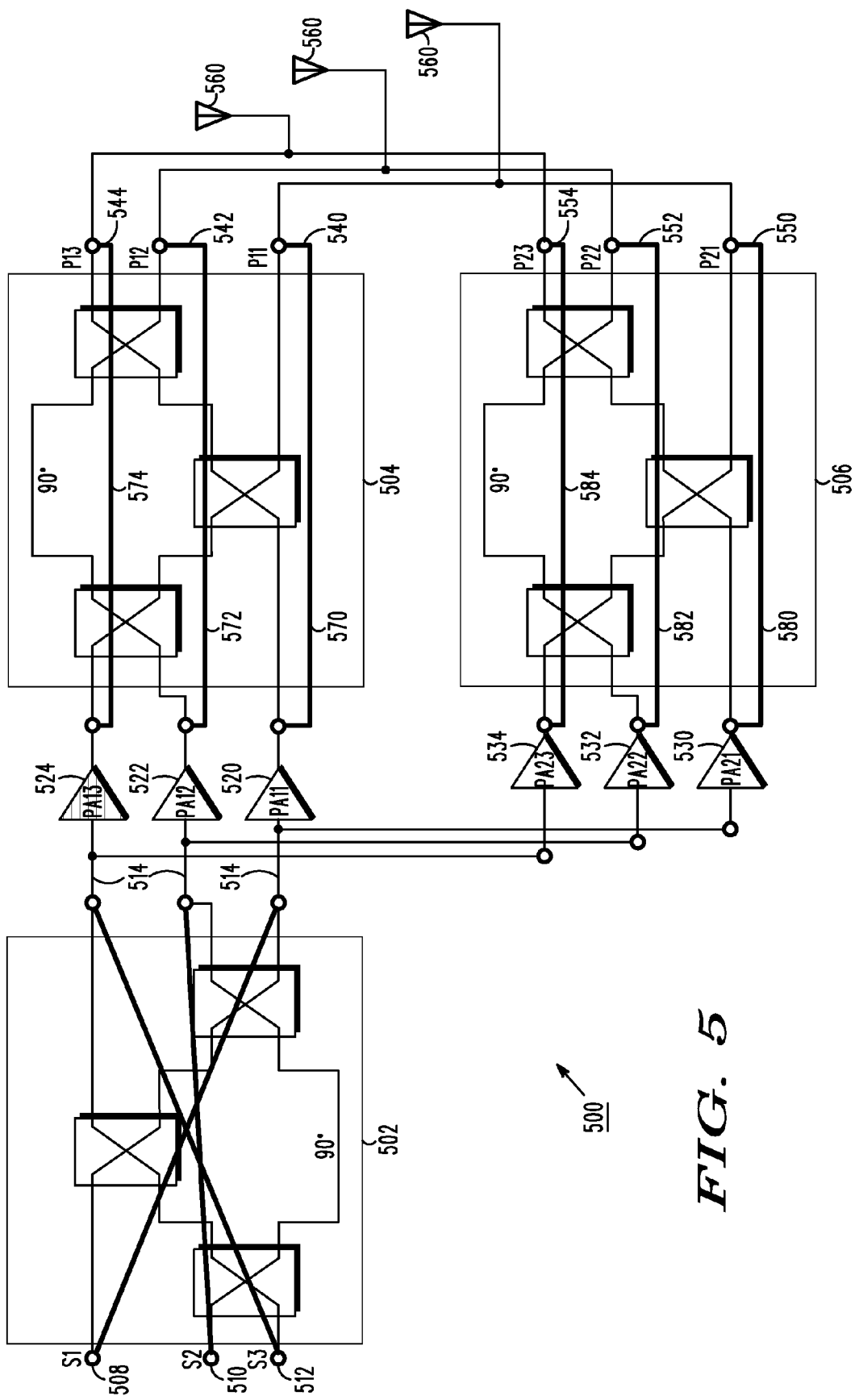
FIG. 5 is an example a Fourier Transform matrix configuration with one input matrix coupled with two output matrices and with a Power Amplifier failure in accordance with some embodiments of the invention.

Referring now to FIG. 5, an exemplary Fourier Transform matrix configuration with one input matrix coupled with two output matrices is shown, although more than 2 output matrices can be used. The FTM configuration 500 has one input FTM 502. The input FTM 502 is a digital FTM. The FTM configuration also has a first output FTM 504 and a second output FTM 506. Both output FTMs 504, 506 are matching analog FTMs. The matrices are shown as 3×3 matrices; however, skilled artisans will appreciate that larger N×N matrices, with more inputs and outputs, can be used.

The input FTM 502 receives three sector signals, S1 508, S2 510, and S3 512. Three transmit paths 514 connect the output of input FTM 502 with amplifiers, PA11 520, PA12 522, PA13 524, PA21 530, PA22 532, and PA23 534. Outputs of PA11 520, PA12 522, and PA13 524 are connected to the inputs of the first output FTM 504. Outputs of PA21 530, PA22 532, and PA23 534 are connected to the inputs of the second output FTM 506. The first output FTM 504 has output ports P11 540, P12 542, and P13 544. The second FTM 506 has output ports P21 550, P22 552, and P23 554. The outputs of the first output FTM 504 and the second output FTM 506 are coupled together. Thus, P11 540 is coupled with P21 550, P12 542 coupled with P22 552, and P13 544 is coupled P23 554. The coupled outputs are connected to antenna 560.

A first RF switch 570 is coupled at one end to the output of PA11 520. The first RF switch 570 is coupled at the other end to P11 540. A second RF switch 572 is coupled at one end to the output of PA12 522. The second RF switch 572 is coupled at the other end to P12 542. A third RF switch 574 is coupled at one end to the output of PA13 524. The third RF switch 574 is coupled at the other end to P13 544. A fourth RF switch 580 is coupled at one end to the output of PA21 530. The fourth RF switch 580 is coupled at the other end to P21 550. A fifth RF switch 582 is coupled at one end to the output of PA22 532. The fifth RF switch 582 is coupled at the other end to P22 552.

A sixth RF switch 584 is coupled at one end to the output of PA23 534. The sixth RF switch 584 is coupled at the other end to P23 554.

Figure 6:
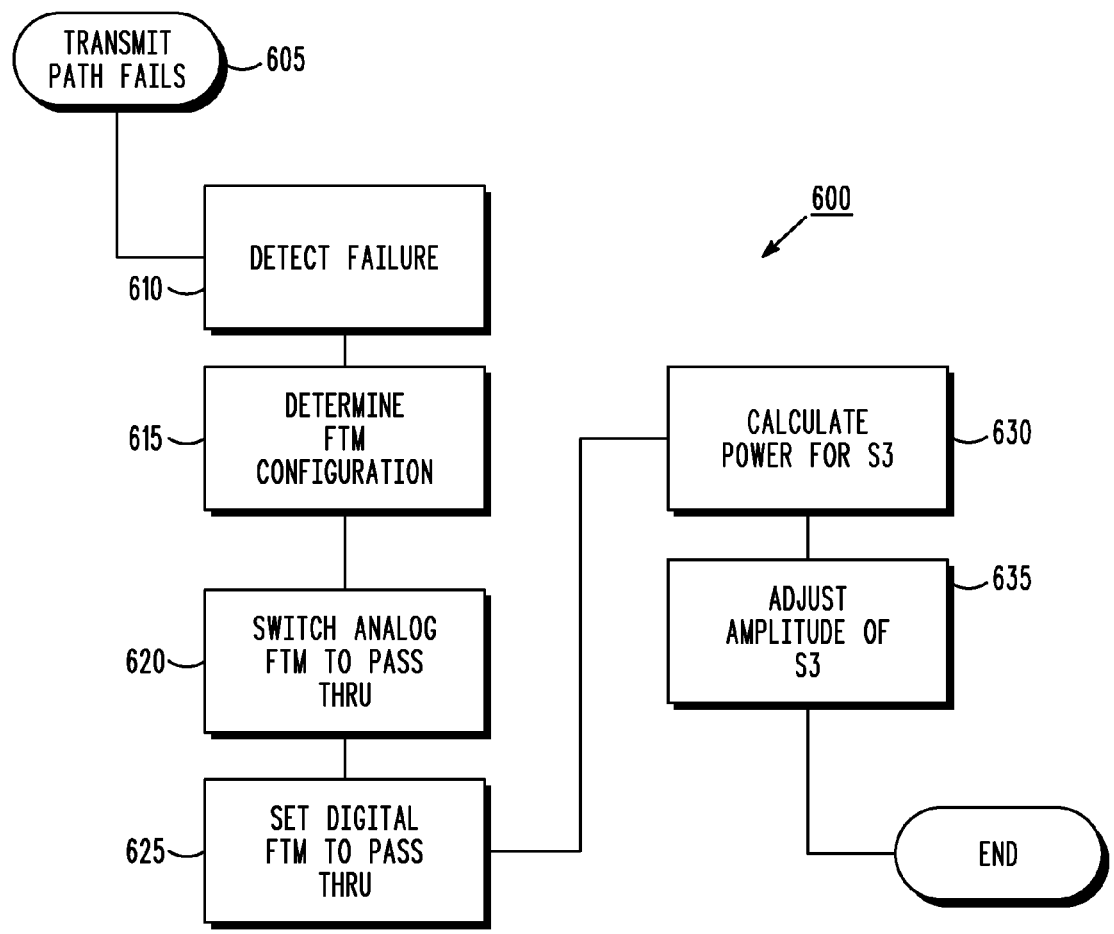
FIG. 6 is a flow diagram illustrating one exemplary mode of operation of the FTM configuration of FIG. 5.

Referring now to FIG. 6, a flow diagram illustrating one exemplary mode of operation of the FTM configuration of FIG. 5 is shown. The steps and methods described with respect to FIG. 6 may occur during a time when any amount of data transmission, including when little or no data transmission, is occurring on any of the transmit paths 514. In this example, a transmit path, e.g., PA13 524, fails at step 605. At step 610, a controller 165 on the base station 150 detects the transmit path failure. The failure may be, for example, a complete shutdown of PA13 524, or the failure may be that PA13 524 is operating below an acceptable performance level. At step 615 the controller 165 determines that the matrix configuration 500 is a matrix cluster of one input matrix 502 associated with a two output matrices 504, 506. Without manual intervention, the controller 165 switches both output FTMs 504, 506 to a pass-thru mode at step 620. The controller 165 switches the output FTMs 504, 506 to a pass-thru mode by closing the RF switches 570, 572, 574, 580, 582, and 584.

At step 625, the input FTM 502 is set to a pass-thru mode. The controller 165 sets the input FTM 502 to a pass-thru mode by replacing the input table with the pass-thru table; Table 3 shown above. The order of steps 620 and 625 is exemplary. Step 625, wherein the input FTM 502 is set to a pass-thru mode, may occur prior to step 620, the controller switching both output FTMs 504, 506 to a pass-thru mode.

In this case, the input FTM 502 and both output FTMs 504, 506 are reconfigured as the result of the failure of PA13 524. Sector three, S3 512 is still transmitted along the transmit path 514, through PA23 534, and through the second output FTM 506. S3 512 is then sent through P23 554 to the antenna 560. Although S3 512 is still transmitted, it is now transmitted at a reduced power. The reduction in S3 512 is approximately 3 dB. However, Sector one, S1 508, and Sector two, S2 510 continue to operate at full power and full data transmission rate.

Therefore, all three sectors still operate; one at a reduced power. If the "reduced" power sector S3 512 was not operating at a full rated power prior to the PA failure, then the FTM amplifier 180 could actually increase its power to that sector, S3 512. In other words, the PA23 534 of the second output FTM 506 could increase the gain such that overall loss of power to the reduced sector is either minimized or eliminated entirely. Therefore, at step 630, the power requirements for the S3 512 are calculated to determine if S3 512 operating at full power. If S3 512 was not operating at full power, the amplitude of S3 512 is adjusted in step 635.

Figure 7:
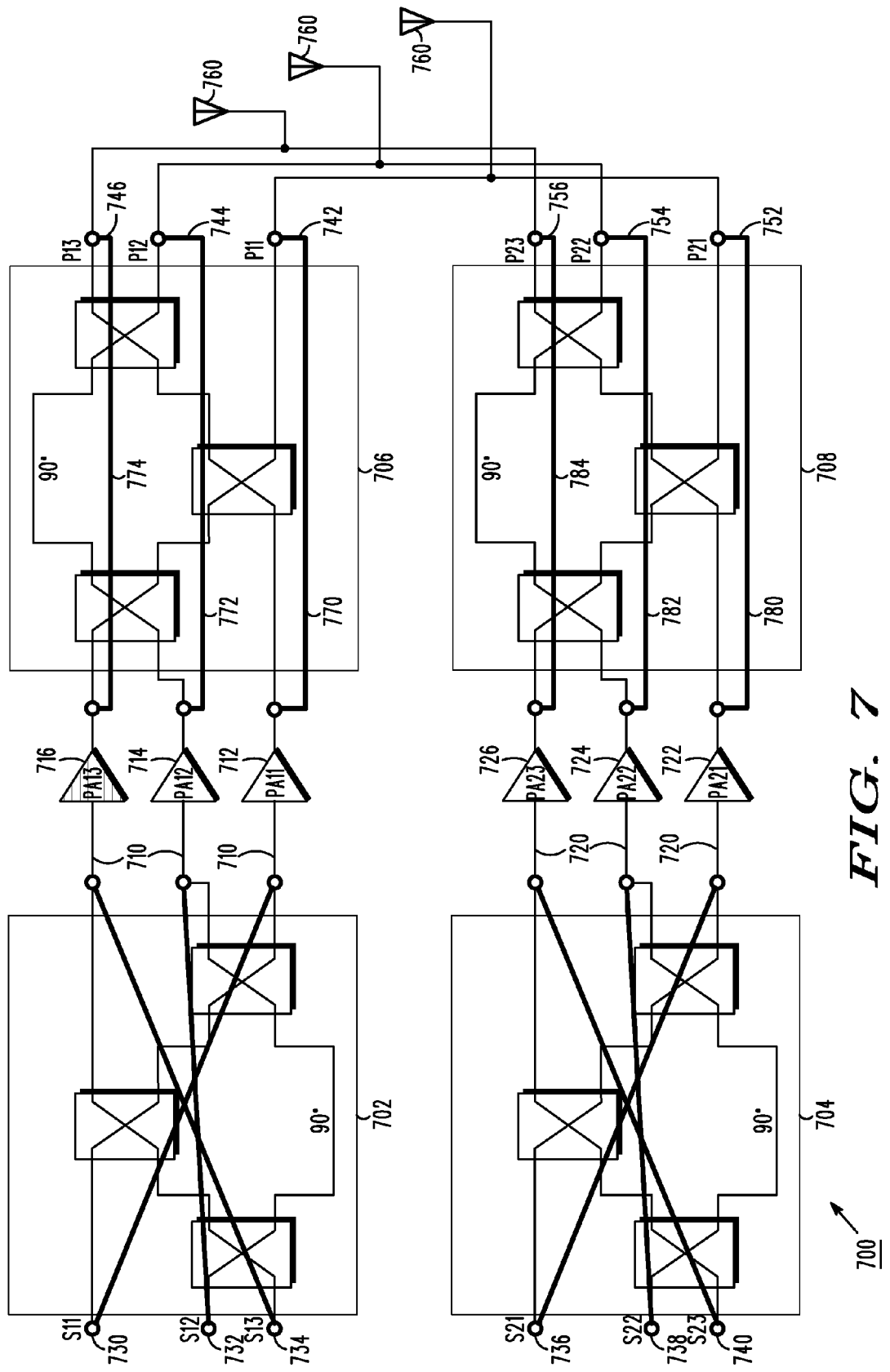
FIGS. 7 and 9 are examples of a Fourier Transform matrix configuration with equal numbers of input matrices and output matrices and with a Power Amplifier failure in accordance with some embodiments of the invention.
Figure 9:
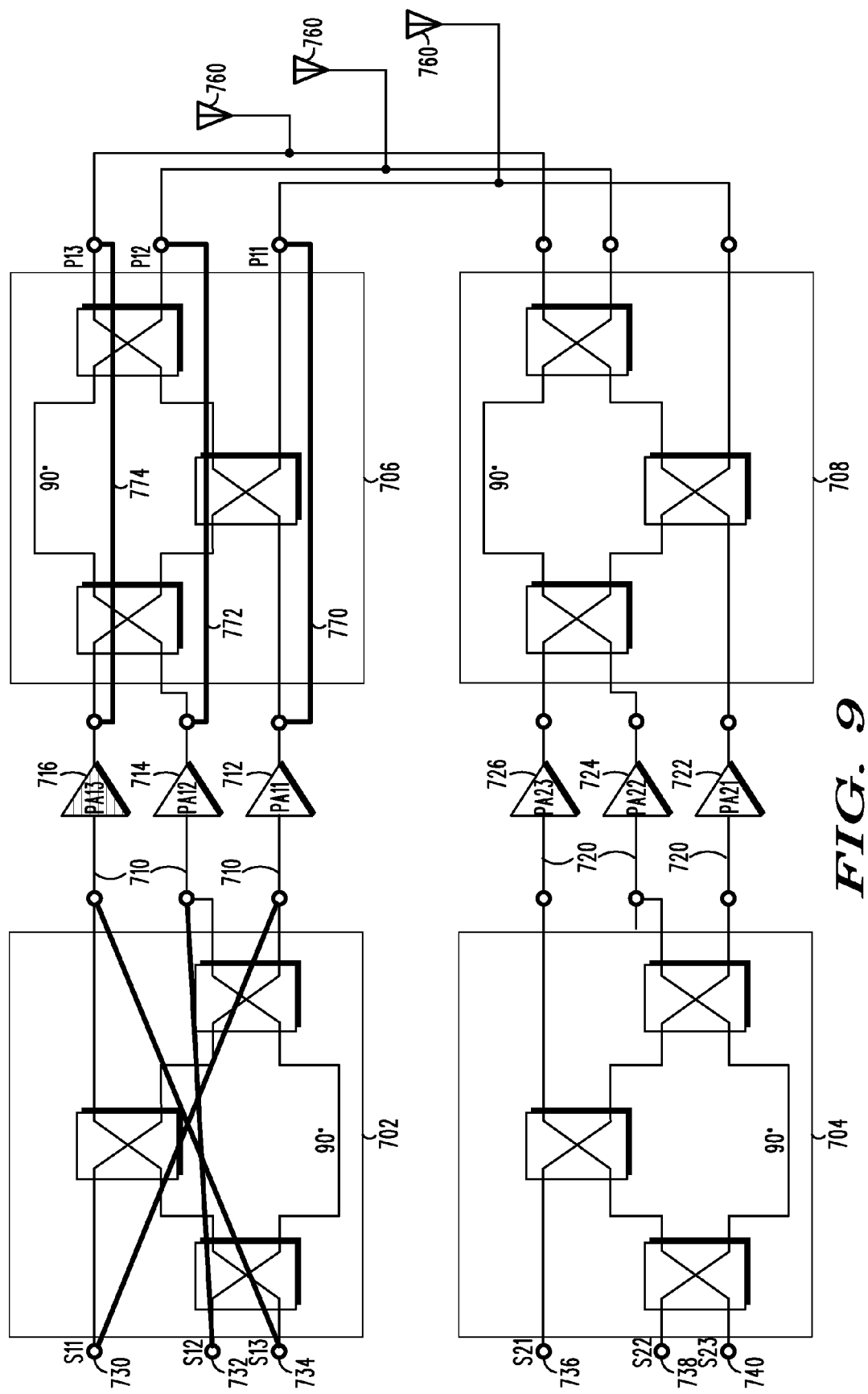

Referring now to FIGS. 7 and 9, examples of a Fourier Transform matrix configuration with equal numbers of input matrices and output matrices in accordance with some embodiments of the invention are shown. The FTM configuration 700 has an equal number of input FTMs and output FTMs. Shown in FIGS. 7 and 9 are an FTM configuration with 2 input FTMs and 2 output FTMs. More than 2 input FTMs and more than 2 output FTMs can be used. Furthermore, the example shown in FIGS. 7 and 9 illustrate that the number of input FTMs equals the number of output FTMs.

The FTM configuration 700 has a first input FTM 702 and a second input FTM 704. The input FTMs 702, 704 are digital FTMs. The FTM configuration 700, additionally has a first output FTM 706 and a second output FTM 708. The output FTMs 706, 708 are analog FTMs. Three transmit paths 710 with three power amplifiers, PA 11 712, PA12 714, and PA13 716, are connected between the first input FTM 702 and the first output FTM 706. Three transmit paths 720 with three power amplifiers, PA21 722, PA22 724, and PA23 726, are connected between the second input FTM 704 and the second output FTM 708.

The input FTM 702 receives three sector signals, S11 730, S12 732, and S13 734. The input FTM 704 receives three sector signals, S21 736, S22 738, and S23 740. Skilled artisans would appreciate that the sector signals of the first input FTM 702 and the second input FTM 704 can be sent by the same carrier or different carriers. As such, a first carrier could be sent to the first input FTM 702 and a second carrier could be sent to the second input FTM 706. Outputs of PA11 712, PA12 714, and PA13 716 are connected to the inputs of the first output FTM 706. Outputs of PA21 722, PA22 724, and PA23 726 are connected to the inputs of the second output FTM 708. P11 742, P12 744, and P13 746 are the output ports of the first output FTM 706. P21 752, P22 754, and P23 756 are the output ports of the second output FTM 708. The outputs of the first output FTM 706 and the second output FTM 708 are coupled together. Thus, P11 742 is coupled with P21 752, P12 744 coupled with P22 754, and P13 746 is coupled P23 756. The coupled outputs are connected to antenna 760.

A first RF switch 770 is coupled at one end to the output of PA11 712. The first RF switch 770 is coupled at the other end to P11 742. A second RF switch 772 is coupled at one end to the output of PA12 714. The second RF switch 772 is coupled at the other end to P12 744. A third RF switch 774 is coupled at one end to the output of PA13 716. The third RF switch 774 is coupled at the other end to P13 746. A fourth RF switch 780 is coupled at one end to the output of PA21 722. The fourth RF switch 780 is coupled at the other end to P21 752. A fifth RF switch 782 is coupled at one end to the output of PA22 724. The fifth RF switch 782 is coupled at the other end to P22 754. A sixth RF switch 784 is coupled at one end to the output of PA23 726. The sixth RF switch 784 is coupled at the other end to P23 756. The RF switches, 770, 772, 774, 780, 782 and 784 each provide a signal by-pass route through or around the output FTMs 706 and 708 or specific elements thereon.

Figure 8:
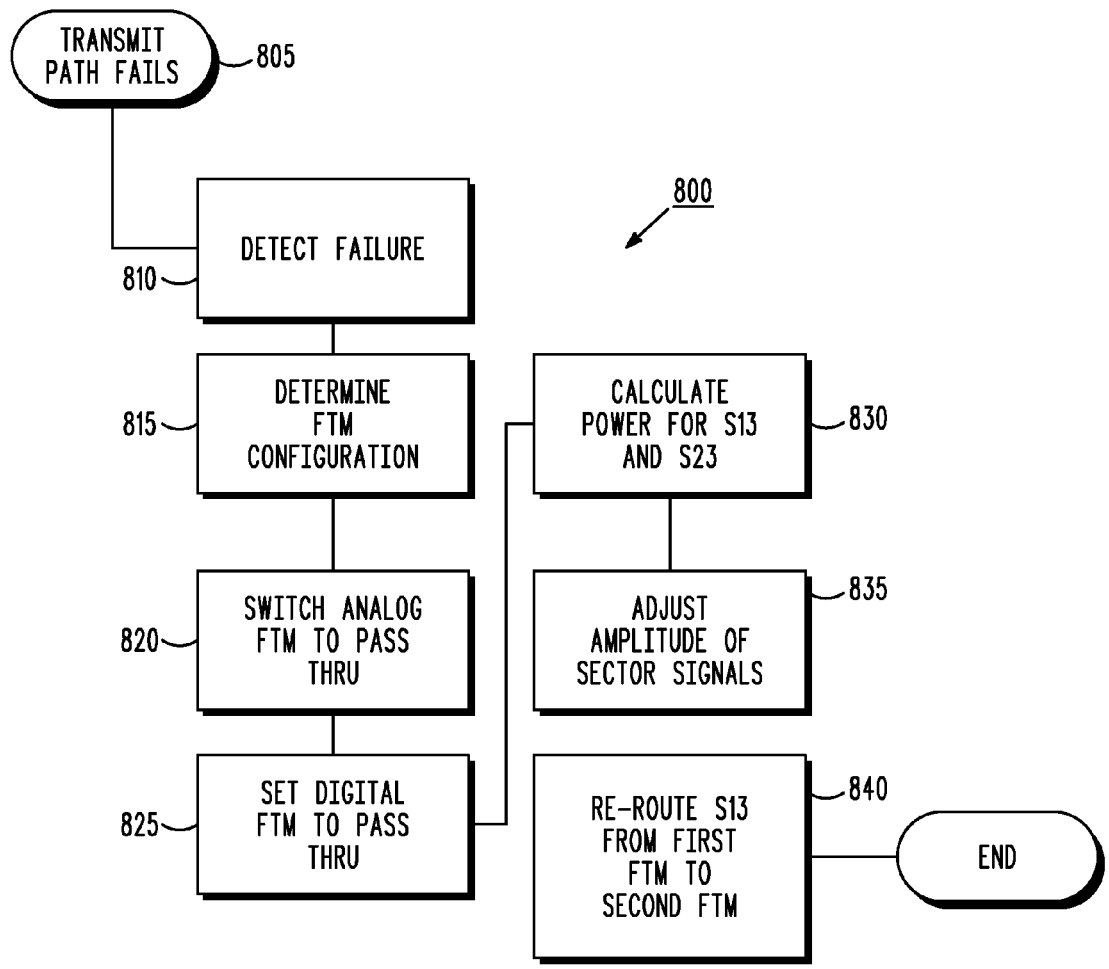
FIGS. 8 and 10 are flow diagrams illustrating exemplary modes of operation of the FTM configurations of FIGS. 7 and 9 respectively.

Referring now to FIG. 8, a flow diagram illustrating one exemplary mode of operation of the FTM configuration of FIG. 7 is shown. The steps and methods described with respect to FIG. 8 may occur during a time when little or no data transmission is occurring on any of the transmit paths 710, 720. In this example, a transmit path, e.g., PA13 716, fails at step 805. At step 810, a controller 165 on the base station 150 detects the failure. The failure may be, for example, a complete shutdown of PA13 716, or the failure may be that PA13 716 is operating below an acceptable performance level. At step 815 the controller 165 determines that the matrix configuration 700 is a matrix cluster of two input matrices 702, 704 associated with two output matrices 706, 708. Without manual intervention, the controller 165 switches both output FTMs 706, 708 to a pass-thru mode at step 820. The controller 165 switches the output FTMs 706, 708 to a pass-thru mode by closing the RF switches 770, 772, 774, 780, 782, and 784. In an alternate embodiment, the controller 165 switches the output FTMs 706, 708 to a pass-thru mode by sending a signal to an exciter on the each output FTM 706, 708.

At step 825, the input FTMs 702, 704 are set to a pass-thru mode. The controller 165 sets the input FTMs 702, 704 to a pass-thru mode by replacing the input table with the pass-thru table. However, since the outputs of the output FTMs 706, 708 are combined, table 3 is not used and a new pass-thru table, Table 4 is used. The order of steps 820 and 825 is exemplary. Step 825, wherein the input FTMs 702, 704 are set to a pass-thru mode, may occur prior to step 820, the controller switching both output FTMs 706, 708 to a pass-thru mode.

The outputs of two FTM clusters are being combined. It is assumed that the thru paths were made with a zero degree phase shift. Therefore the input table is reconfigured to match the phases measured at the output as described above. Thus, the pass-thru table to reconfigure the digital (input) FTM 702, 704 is shown in Table 4:

TABLE 4

Reconfigured Digital FTM (Thru phase shift equals 0)

|    | Path 3   | Path 2    | Path 1    |
| -- | -------- | --------- | --------- |
| S1 | 0        | 0         | 1∠172.7°  |
| S2 | 0        | 1∠171.9°  | 0         |
| S3 | 1∠−56.5° | 0         | 0         |

Note that the phase shifts were applied to the digital FTM parameters. This phase shift could be introduced at any point or at combined points in the forward path.

In this case, both input FTMs 702, 704 and both output FTMs 706, 708 are reconfigured as a result of the failure of PA13 716. Sector three, S13 734 is no longer able to transmit along the transmit path 710. However, at step 840, S13 734 is re-routed from the first input FTM 702 to the S23 740 of the second input FTM 704. Therefore, S13 734 is still transmitted. However, S13 734 is now transmitted, along with S23 740, through the second input FTM 704 through transmit path 720 to PA23 726. S13 734, along with S23 740, then is sent through the second output FTM 708, through P23 756 to the antenna 760. As such, the power requirements for both S13 734 and S23 740 are calculated in step 830 (prior to re-routing in step 840). Although S13 734 is still transmitted, it is now possibly transmitted at a reduced power. That is, as long as S23 740 does not require the full extent of the PA23's power capability, then S13 713 can use the available headroom to increase the power. This may result in a power drop on S13 734 between zero and three (3) dB. Therefore, the amplitude of S13 734 and S23 740 are adjusted, prior to the second input FTM 704, in step 835. However, Sector one, S11 730, and Sector two, S12 732 continue to operate at full power and full data transmission rate. Additionally, all three sector signals S21 736, S22 738, and S23 740 continue to operate at full power and full data transmission rate.

Therefore, all three sectors of each input FTM 702, 704 still operate; with one at a potentially reduced power. If the "reduced" power sector S13 734 was not operating at a full rated power initially, then the digital controller could increase the S13 734 power accordingly. Therefore, power to the reduced sector is either minimized or eliminated entirely. In an alternate embodiment, rather than adjust the power of S13 734, the gain of amplifier 726 of the second matrix cluster (second input FTM 704 and second output FTM 708) is adjusted.

Figure 10:
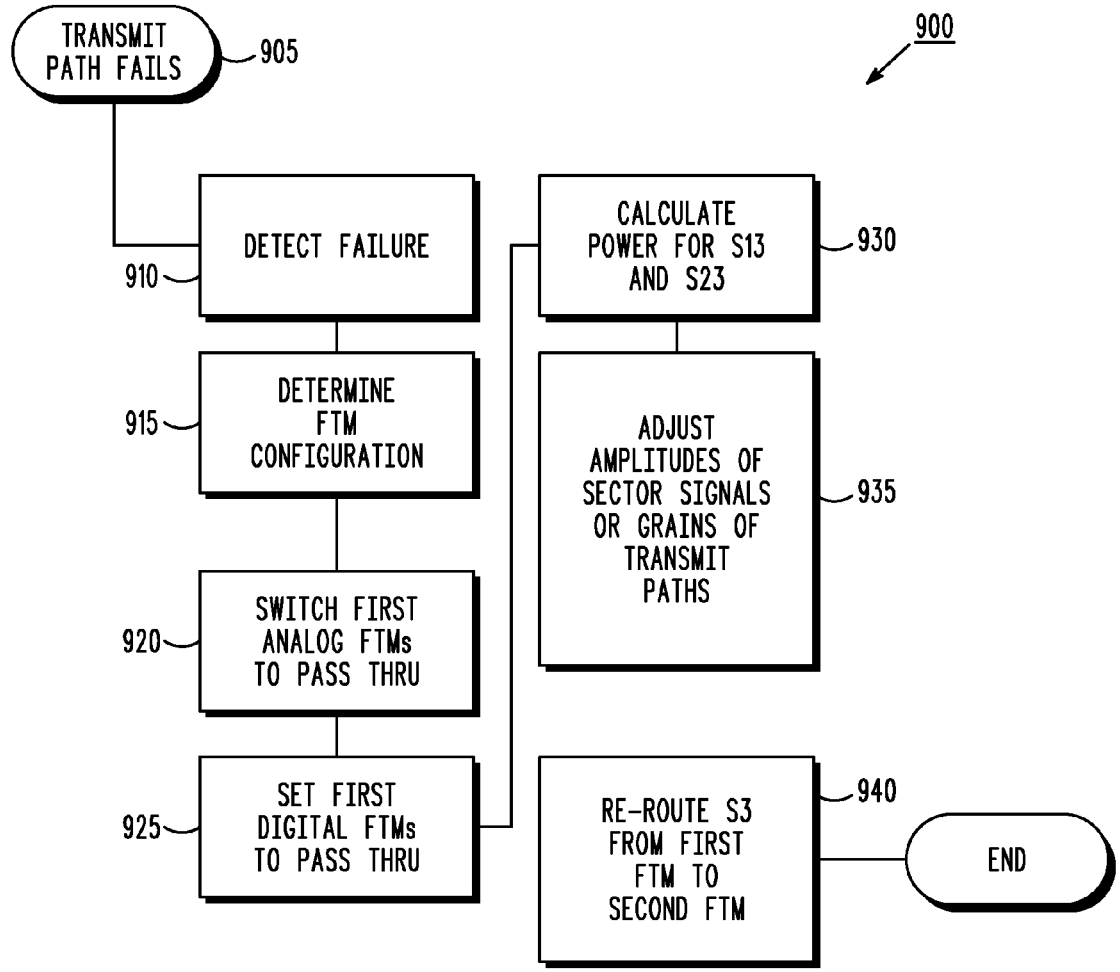

Referring now to FIG. 10, a flow diagram illustrating one exemplary mode of operation of the FTM configuration of FIG. 9 is shown. The steps and methods described with respect to FIG. 9 may occur during a time when little or no data transmission is occurring on any of the transmit paths 710, 720. In this example, a transmit path, e.g., PA13 716, fails at step 905. At step 910, a controller 165 on the base station 150 detects the failure. The failure may be, for example, a complete shutdown of PA13 716, or it may be that PA13 716 is operating below an acceptable performance level. At step 915 the controller 165 determines that the matrix configuration 700 is a matrix cluster of two input matrices 702, 704 associated with two output matrices 706, 708. Without manual intervention, the controller 165 switches the first output FTM 706 to a pass-thru mode at step 920. It should be noted that only the output FTM 706 associated with the failed PA13 716 is switched a pass-thru mode. The controller 165 switches the output FTM 706 to a pass-thru mode by closing the RF switches 770, 772, and 774. In an alternate embodiment, the controller 165 switches the output FTM 706 to a pass-thru mode by sending a signal to an exciter on output FTM 706.

At step 925, the input FTM 702 is set to a pass-thru mode. Again, it should be noted that only the input FTM 702 associated with the failed PA13 716 is switched a pass-thru mode. The controller 165 sets the input FTM 702 to a pass-thru mode by replacing the input table with the pass-thru table; Table 4 shown above. The order of steps 920 and 925 is exemplary. Step 925, wherein the input FTM 702 is set to a pass-thru mode, may occur prior to step 620, the controller switching the output FTMs 706 to a pass-thru mode.

In this embodiment, only the first input FTM 702 and first output FTM 706, associated with failed PA13 716, are reconfigured as the result of the failure of PA13 716. Sector three, S13 734 is no longer able to transmit along the transmit path 710. The power requirements for S13 734 and S23 740 are calculated in step 930. However, at step 940, S13 734 is re-routed from the first input FTM 702 to the S23 740 of the second input FTM 704. Therefore, S13 734 is still transmitted. However, S13 734 is now transmitted through the matrix cluster formed by the second input FTM 704 and the second output FTM 708. Since the second input FTM 704 and the second output FTM 708 have not been switched to a pass-thru mode, S13 734 will be subject again to equations 1-6 illustrated above. By re-routing S13 734 to the second FTM matrix cluster of second input FTM 704 and the second output FTM 708, the gain of all three amplifier paths 722, 724, and 726 may need to be reduced, in step 935, by up to 1.25 dB if all four sector-carriers S13 734, S21 736, S22 738, and S23 740 are running at full power. If all four sector-carriers S13 734, S21 736, S22 738, and S23 740 are not running at full power as in most systems, then no change in gain may be required and there may be no difference in output power of any of the sector-carriers at the output of the antennae. It is noted that instead of dropping the gain of the three amplifiers mentioned above, the same affect could be achieved by dropping the amplitude of the four sector-carriers mentioned instead.

The input and output FTMs 704, 708 of the second FTM cluster remain unchanged. The absolute phase of the thru paths of the first input and output FTMs 702, 706 must match, within reason, the absolute phases at the FTM outputs of the second FTM cluster. As mentioned earlier, this phase match can either be accomplished by building the pass-thru paths to match the FTM path phases or by adjusting the phase somewhere in the forward link paths of the first FTM cluster. All three sectors will be operating, and the FTM benefit still remains. In fact, if the data being transmitted is such that the sector-carriers are not at full rated power, then gain adjustments can be made to either the carrier signals (S13 734, S21 736, S22 738, and S23 740) prior to the second input FTM 704, or to all the transmit paths of the second matrix cluster (second input FTM 704 and second output FTM 708) so that there is no change in power on any of the sector-carriers out of the antennae as received by the mobile handsets. Therefore, if after re-routing S13 734 to the second input FTM 704, the combined power requirement of S13 734, S21 736, S22 738, and S23 740 do not exceed the rated power of the transmit path power amplifier, PA23 726, PA22 724, and PA21 722;

then no gain adjustments may be required. However, if the combined power requirement of S13 734, S21 736, S22 738, and S23 740 does exceed the rated power of the transmit path power amplifiers, PA23 726, PA22 724, and PA21 722; then the amplitude of S13 734 could be adjusted, the amplitude of both S13 734 and S23 736 could be adjusted, the amplitude of S13 734, S21 736, S22 738, and S23 740 could be adjusted, or the gain of all three transmit path PAs 722, 724, or 736 or all three transmit paths 720 could be adjusted.

In the foregoing specification, specific embodiments of the present invention have been described. However, one of ordinary skill in the art appreciates that various modifications and changes can be made without departing from the scope of the present invention as set forth in the claims below.

Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

We claim:

1. A method of reducing data transmission loss after an occurrence of a transmit path failure in a wireless communication network, said wireless communication network comprising a base-station that comprises a Fourier transform matrix configuration, wherein the Fourier transform matrix configuration comprises at least one digital Fourier transform matrix and at least one analog Fourier transform matrix, said at least one digital Fourier transform matrix and said at least one analog Fourier transform matrix comprising a first, a second, and a third sector signal path and comprising a first, a second, and a third transmit path between said at least one digital Fourier transform matrix and said at least one analog Fourier Transform matrix, the signal paths each comprising first, second, and third gains, respectively, and first, second, and third phases respectively, the method comprising:
    detecting by a controller, a reduction in amplitude of a signal from a transmit path between a first digital Fourier transform matrix and a first analog Fourier transform matrix;
    reconfiguring, by the controller, the first digital Fourier transform matrix to a pass-thru mode by replacing usage of an input table with usage of a pass-thru table; and
    re-routing, by the controller, the first analog Fourier transform Matrix to a pass-thru mode;
    coupling an output of the first analog Fourier Transform matrix with an output of a second analog Fourier Transform matrix; and
    transmitting the coupled outputs.

2. The method of claim 1, wherein re-routing, by the controller, comprises sending a switch signal from the controller to the first analog Fourier transform matrix to electronically initiate switching each of the first, second and third sector signal paths of the first analog Fourier transform matrix to a direct signal path connection between each first, second and third input of the first analog Fourier transform matrix and each first, second and third output of the first analog Fourier transform matrix respectively.

3. The method of claim 1, wherein the base-station comprising the Fourier transform matrix configuration further comprises:
    the first analog Fourier transform matrix, and the second analog Fourier transform matrix; having a first, a second and a third transmit path between the first digital Fourier transform matrix and the first analog Fourier transform matrix and a fourth, a fifth and a sixth transmit path between the first digital Fourier transform matrix and a second analog Fourier transform matrix, the transmit paths having a first, a second, a third, a fourth, a fifth and a sixth gain, respectively, and a first, a second, a third, a fourth, a fifth and a sixth phase respectively; and
    re-routing, by the controller, the second analog Fourier transform matrix, to a pass-thru mode.

4. The method of claim 1, wherein the base-station comprising the Fourier transform matrix configuration further comprises:
    an equal number of digital Fourier transform matrices and analog Fourier transform matrices, each with a first, a second, and a third sector and having a first, a second, and a third transmit paths between the digital Fourier transform matrices and the analog Fourier transform matrices, the transmit paths having first, second, and third gains, respectively, and first, second, and third phases respectively.

5. The method of claim 4, wherein the signal with the reduction in amplitude is a sector signal on a first carrier signal and wherein the method further comprising, transferring the sector signal from the first digital Fourier transform matrix to a second digital Fourier transform matrix.

6. The method of claim 5, wherein reconfiguring, by the controller, further comprises reconfiguring a second digital Fourier transform matrix; and
    wherein re-routing, by the controller, further comprises re-routing a second analog Fourier transform matrix.

7. The method of claim 6, further comprising:
    calculating a combined power requirement for the transferred sector signal and a sector signal on a signal path, of the second digital Fourier transform matrix, receiving the transferred sector signal; and
    adjusting a amplitude of the transferred sector signal and a amplitude of the sector signal on the receiving signal path, of the second digital Fourier transform matrix, such the combined power requirement is less than or equal to a total power capacity of a transmit path corresponding to the receiving signal path of the second digital Fourier transform matrix.

8. The method of claim 5, further comprising:
    calculating a combined power requirement for the transferred sector signal and all the sector signals of the second digital Fourier transform matrix; and
    adjusting a amplitude of the transferred sector signal and an amplitude of each of the sector signals of the second digital Fourier transform matrix, such the combined power requirement is less than or equal to a total power capacity of the transmit paths of the second digital Fourier transform matrix.

9. The method of claim 5, further comprising:
    calculating a combined power requirement for the transferred sector signal and all the sector signals of the second digital Fourier transform matrix; and
    adjusting a gain of the transmit paths of the second digital Fourier transform matrix, such that the combined power requirement is less than or equal to the total power capacity of the transmit paths of the second digital Fourier transform matrix.

10. The method of claim 5, wherein reconfiguring, by the controller, further comprises reconfiguring more than one digital Fourier transform matrix; and wherein re-routing, by the controller, further comprises re-routing more than one analog Fourier transform matrix.

11. The method of claim 4, wherein coupling further comprises coupling the output of the first analog Fourier transform matrix with an output of more than one of a number of analog Fourier transform matrices.

12. The method of claim 5, wherein the first carrier signal comprises a plurality of carrier signals and second carrier signal comprises a plurality of carrier signals.

13. A system for reducing data transmission loss after the occurrence of a power amplifier failure in a wireless communication network, the system comprising:
 a base-station comprising a transmitter, said transmitter comprising a Fourier transform matrix configuration that comprises at least one digital Fourier transform matrix and at least one analog Fourier transform matrix;
 a plurality of transmit paths between said at least one digital Fourier transform matrix and said at least one analog Fourier transform matrix; wherein each one of said plurality of said transmit paths comprises a power amplifier for amplifying a sector signal in the transmit path;
 a pass-thru switch on said at least one analog Fourier transform matrix;
 a database for storing configuration tables for said at least one digital Fourier transform matrix;
 a controller programmed to perform the steps of:
  determining if a fault exists in one of said transmit paths;
  updating, in response to the determining, an input table of said at least one input digital Fourier Transform matrix with a pass-thru table; and
  reconfiguring at least one output analog Fourier Transform matrix to a pass-thru mode based on updating an input table of said at least one input digital Fourier Transform matrix with the pass-thru table.

14. The system of claim 13, wherein said transmitter further comprises a first analog Fourier transform matrix and a second analog Fourier transform matrix.

15. The system of claim 14, wherein an output of said first analog Fourier transform matrix is coupled to an output of said second analog Fourier transform matrix.

16. The system of claim 13, wherein said transmitter further comprises an equal number of digital Fourier transform matrices and analog Fourier transform matrices.

17. The system of claim 16, wherein an output of said first analog Fourier transform matrix is coupled to an output of said second analog Fourier transform matrix.

18. The system of claim 16, wherein a said controller is further programmed for updating said input table of said digital Fourier transform matrix associated with said determined fault, reconfiguring only said analog Fourier Transform matrix associated with said determined fault, and rerouting said sector signal to a second digital Fourier transform matrix.

19. The system of claim 16, wherein a said controller is further programmed for updating said input table for all said digital Fourier transform matrices and reconfiguring all said analog Fourier transform matrices.

20. The system of claim 13, wherein said controller reconfigures said output analog Fourier transform matrix by sending a signal to said analog Fourier transform matrix.

* * * * *